(12) United States Patent
Urashima et al.

(10) Patent No.: US 8,665,207 B2
(45) Date of Patent: Mar. 4, 2014

(54) DISPLAY CONTROL APPARATUS AND CONTROL METHOD THEREOF, AND COMPUTER PROGRAM

(75) Inventors: Hiroki Urashima, Tokyo (JP); Eriko Ozaki, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 1516 days.

(21) Appl. No.: 11/931,699

(22) Filed: Oct. 31, 2007

(65) Prior Publication Data

US 2008/0106514 A1 May 8, 2008

(30) Foreign Application Priority Data

Nov. 7, 2006 (JP) .................................. 2006-302133

(51) Int. Cl.
*G09G 5/00* (2006.01)

(52) U.S. Cl.
USPC ........... 345/156; 348/569; 348/564; 348/563; 715/827; 715/817; 715/831; 715/840; 345/157; 345/172; 345/173; 725/44; 725/39; 725/40; 725/41

(58) Field of Classification Search
USPC .......... 345/204, 156; 725/39, 68, 52; 715/600
See application file for complete search history.

(56) References Cited

U.S. PATENT DOCUMENTS

| | | | | |
|---|---|---|---|---|
| 5,537,152 A | * | 7/1996 | Ishikawa | 725/56 |
| 5,598,523 A | * | 1/1997 | Fujita | 715/840 |
| 6,018,372 A | * | 1/2000 | Etheredge | 725/44 |
| 6,177,931 B1 | * | 1/2001 | Alexander et al. | 725/52 |
| 6,246,441 B1 | * | 6/2001 | Terakado et al. | 348/552 |
| 2003/0005441 A1 | * | 1/2003 | Inoue | 725/39 |

FOREIGN PATENT DOCUMENTS

| | | | |
|---|---|---|---|
| JP | 2000-089892 | | 3/2000 |
| JP | 2002-118796 A | | 4/2002 |
| JP | 2002118796 A | * | 4/2002 |
| JP | 2002-281215 | | 9/2002 |
| JP | 2003-018487 | | 1/2003 |

OTHER PUBLICATIONS

The above reference was cited in a Jan. 27, 2012 Japanese Office Action, which is enclosed without an English Translation, that issued in Japanese Patent Application No. 2006-302133.

* cited by examiner

*Primary Examiner* — Grant Sitta

(74) *Attorney, Agent, or Firm* — Cowan, Liebowitz & Latman, P.C.

(57) ABSTRACT

A display control apparatus includes an input unit which has plural types of keys and accepts an operation of a key from the user, a display unit which displays a screen which allows the user to operate the input unit, and a display controller which selectively displays plural screens of the display unit in accordance with the types of keys operated on the input unit. When the display controller controls the display unit to display a screen for making the user make a key operation using any one type of key of the plural types of keys, and accepts an operation of a key of a type other than the any one type of key, it switches the screen to another screen for making the user make an operation using the other type of key.

15 Claims, 20 Drawing Sheets

FIG. 5

| KEY TYPE | UI TYPE |
|---|---|
| CURSOR KEYPAD 210 | PROGRAM GUIDE DISPLAY SCREEN 300 |
| NUMERIC KEYPAD 220 | SINGLE CHANNEL PROGRAM SELECTION SCREEN 400 |

FIG. 8

| KEY TYPE | KEY CODE | TIME |
|---|---|---|
| CURSOR KEY | UP | 11:00:05 |
| NUMERIC KEY | 1 | 11:00:02 |
| NUMERIC KEY | 2 | 10:59:48 |
| NUMERIC KEY | 3 | 10:59:40 |
| . | . | . |
| . | . | . |
| . | . | . |

| KEY TYPE | CONDITION | UI TYPE |
|---|---|---|
| CURSOR KEYPAD 210 | NONE | PROGRAM GUIDE DISPLAY SCREEN 300 |
| NUMERIC KEYPAD 220 | RIGHT OR LEFT KEY 212 OR 211 OF CURSOR KEYPAD 210 | SINGLE TIME ZONE PROGRAM SELECTION SCREEN 1000 |
| | UP OR DOWN KEY 213 OR 214 OF CURSOR KEYPAD 210 | SINGLE CHANNEL PROGRAM SELECTION SCREEN 400 |

FIG. 14

| KEY TYPE | CONDITION | UI TYPE |
|---|---|---|
| CURSOR KEYPAD 210 | NONE | PROGRAM GUIDE DISPLAY SCREEN 300 |
| NUMERIC KEYPAD 220 | LEFT KEY 211 OF CURSOR KEYPAD 210 | SINGLE TIME ZONE PROGRAM SELECTION SCREEN 1000 |
| | RIGHT KEY 212 OF CURSOR KEYPAD 210 | SINGLE TIME ZONE PROGRAM SELECTION SCREEN 1300 |
| | UP KEY 213 OF CURSOR KEYPAD 210 | SINGLE CHANNEL PROGRAM SELECTION SCREEN 1200 |
| | DOWN KEY 214 OF CURSOR KEYPAD 210 | SINGLE CHANNEL PROGRAM SELECTION SCREEN 400 |

FIG. 16

| KEY TYPE | CONDITION | UI TYPE |
|---|---|---|
| CURSOR KEYPAD 210 | NUMERIC KEY 221 "1" | PROGRAM GUIDE DISPLAY SCREEN 1700 |
| | NUMERIC KEY 222 "2" | PROGRAM GUIDE DISPLAY SCREEN 1800 |
| | ... | ... |
| | NUMERIC KEY 229 "9" | PROGRAM GUIDE DISPLAY SCREEN 1900 |
| NUMERIC KEYPAD 220 | LEFT KEY 211 OF CURSOR KEYPAD 210 | SINGLE TIME ZONE PROGRAM SELECTION SCREEN 1000 |
| | RIGHT KEY 212 OF CURSOR KEYPAD 210 | SINGLE TIME ZONE PROGRAM SELECTION SCREEN 1300 |
| | UP KEY 213 OF CURSOR KEYPAD 210 | SINGLE CHANNEL PROGRAM SELECTION SCREEN 1200 |
| | DOWN KEY 214 OF CURSOR KEYPAD 210 | SINGLE CHANNEL PROGRAM SELECTION SCREEN 400 |

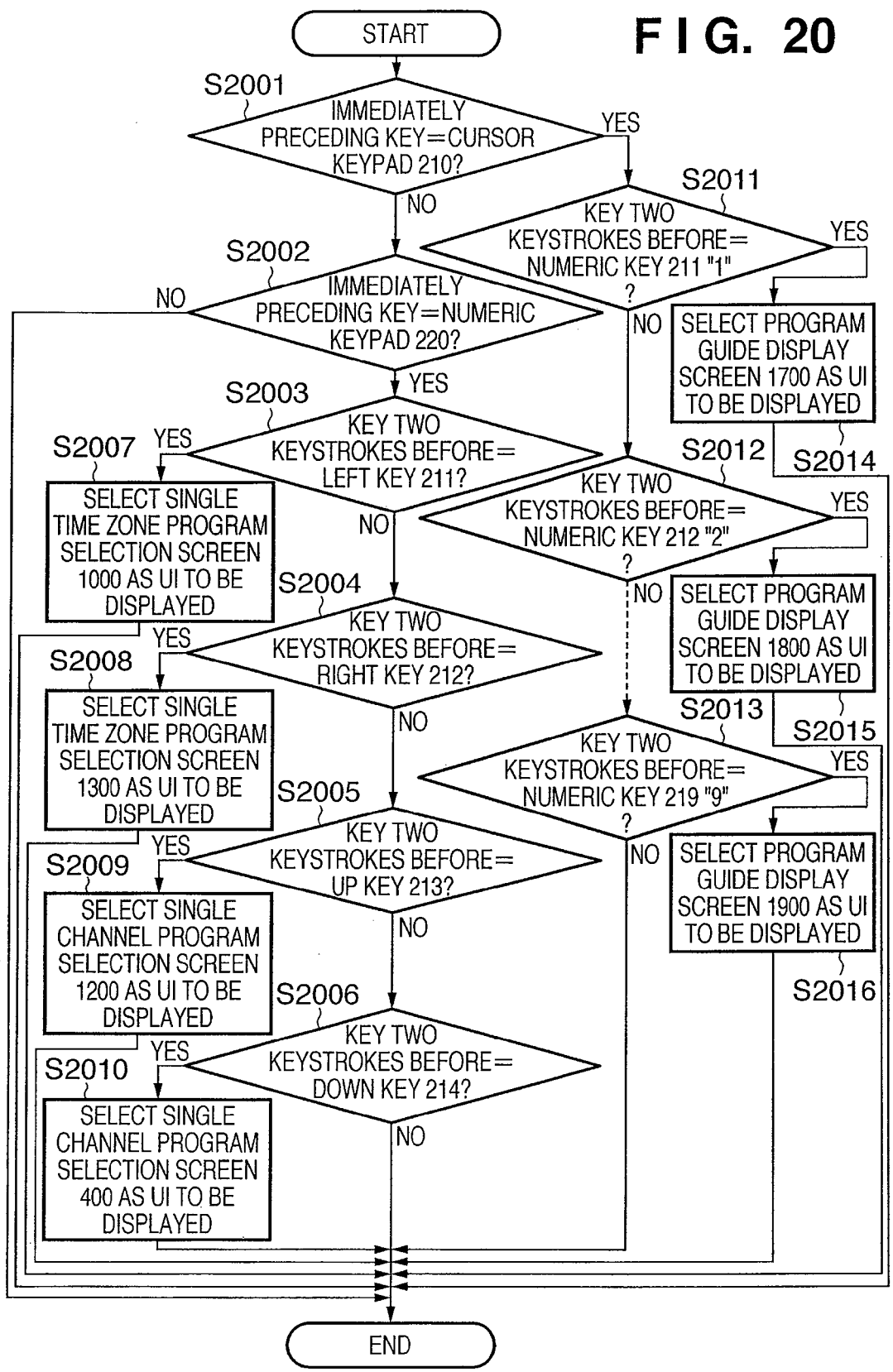

DISPLAY CONTROL APPARATUS AND CONTROL METHOD THEREOF, AND COMPUTER PROGRAM

BACKGROUND OF THE INVENTION

1. Field of the Invention

The present invention relates to a display control apparatus and control method thereof, and a computer program.

2. Description of the Related Art

PCs and embedded devices have various user interfaces which provide many operation methods to users. For example, a remote controller for a TV broadcast recorder has numeric keys, cursor keys, and the like, and provides an operation method that allows the user to input a channel using the numeric keys and to select a menu using the cursor keys. However, although multiple user interfaces are provided, the user can only use a single user interface for one or a series of operations (problem 1).

Also, conventionally, only a routine operation sequence is provided for one or a series of operations, and the operability cannot be improved (problem 2).

Furthermore, since the user cannot select user interfaces used to input in correspondence with operations, he or she cannot perform operations intuitively (problem 3).

In order to solve these problems, the following techniques have been proposed.

To solve problem 1, a technique that allows the user to use multiple interfaces by switching interfaces used to input depending on areas on a screen has been proposed (see Japanese Patent Laid-Open No. 2000-89892). However, in this case, since the user interfaces are switched depending on the areas, the user may be confused when switching.

To solve problem 2, a technique that determines a user's record of operations as a user's learning level, and allows the user to change accessible functions in a UI displayed depending on the learning level has been proposed (see Japanese Patent Laid-Open No. 2002-281215). However, in this case, the user's record of operations cannot be used to improve the operability of the user interface.

To solve problem 3, a technique has been proposed (see Japanese Patent Laid-Open No. 2003-18487) which divides an electronic program guide into nine parts in correspondence with the numeric keys of the remote controller, and allows the user to efficiently narrow down programs that he or she wants to record by selecting the divided part using the corresponding numeric key, so as to allow an intuitive movement from the full guide into details has been proposed (see Japanese Patent Laid-Open No. 2003-18487). However, flexible operation is not possible in this case, because interfaces other than the number keys are not usable while the user is in the process of selection.

SUMMARY OF THE INVENTION

As described above, conventionally, it is difficult to improve the operability of a user interface while providing many intuitive operation methods to the user. Hence, it is an object of the present invention to improve the operability of a user interface, while providing many intuitive operation methods to the user.

The present invention provides a display control apparatus comprising, an input unit comprising plural types of keys and adapted to accept a key operation from a user, a display unit adapted to display a screen which allows the user to operate the input unit, and a display controller adapted to control the display unit to switch plural screens including identical information in at least certain areas thereof in accordance with the types of keys operated on the input unit, wherein when the display controller controls the display unit to display a screen for making the user make the key operation using any one type of key of the plural types of keys, and the key operation using the other type of key than the any one type of key is accepted, the display controller switches the screen to another screen for making the user make the key operation using the other type of key.

Further features of the present invention will become apparent from the following description of exemplary embodiments with reference to the attached drawings.

BRIEF DESCRIPTION OF THE DRAWINGS

FIG. 5 is a table showing the correspondence between input key types and UI types to be selected according to the key types according to the first embodiment of the present invention;

FIG. 8 is a table showing an example of the data structure of key information saved in a data memory 105 according to the first embodiment of the present invention;

FIG. 9 is a table showing the correspondence between input key types and key codes, and UI types to be selected according to them according to the second embodiment of the present invention;

FIG. 14 is a table showing the correspondence between input key types and key codes, and UI types to be selected according to them according to the third embodiment of the present invention;

FIG. 16 is a table showing the correspondence between input key types and key codes, and UI types to be selected according to them according to the fourth embodiment of the present invention;

FIG. 20 is a flowchart showing an example of the UI type selection processing according to the fourth embodiment of the present invention.

DESCRIPTION OF THE EMBODIMENTS

Preferred embodiments of the present invention will be described in detail hereinafter with reference to the accompanying drawings.

First Embodiment

Figure 1:
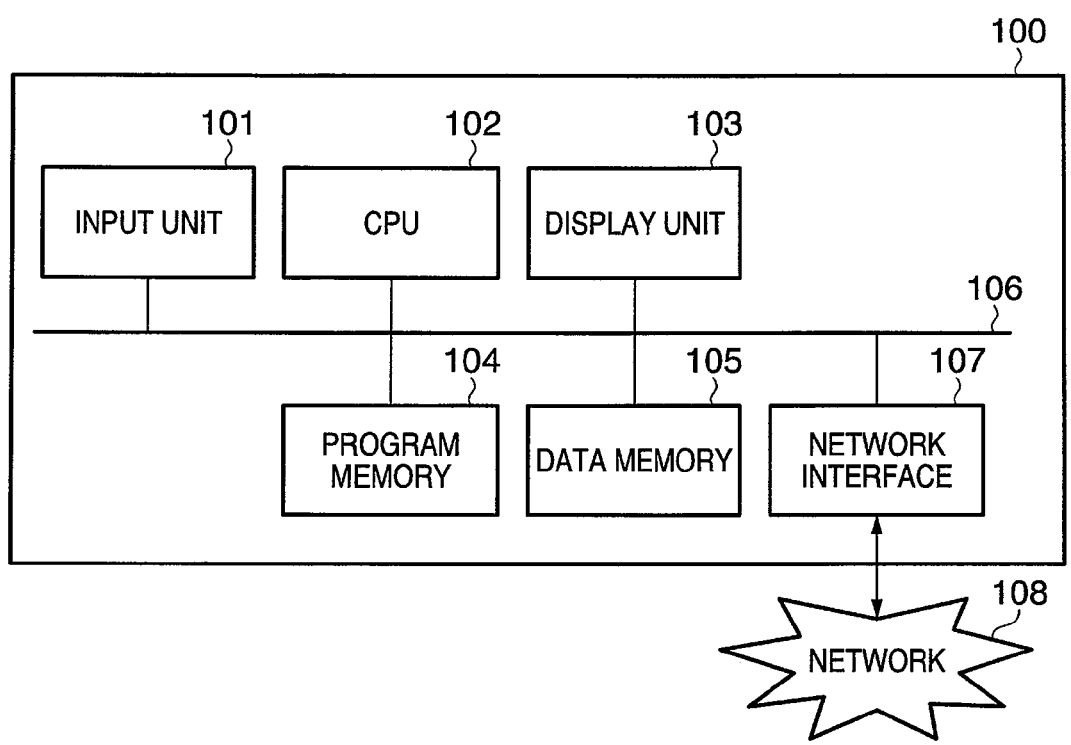
FIG. 1 is a block diagram showing an example of the arrangement of a display control apparatus 100 according to one embodiment of the present invention.

FIG. 1 is a block diagram showing an example of the hardware arrangement of a display control apparatus according to the present invention. Referring to FIG. 1, a display control apparatus 100 can comprise the following components.

An input unit 101 is used to input information (data), and may comprise a keyboard, mouse, or a remote controller capable of remote input. This embodiment will explain a case wherein the input unit 101 is implemented as a remote controller 200.

A CPU 102 makes arithmetic operations, logical judgments, and the like to implement various processes, and controls respective components connected to a bus 106. A display unit 103 displays information (data). The display unit 103 includes a display such as an LCD, CRT, or the like. A program memory 104 stores programs required for control by the CPU 102, which includes conditional judgments and screen control. The program memory 104 also stores display data used to display screens on the display unit 103. These display data correspond to FIGS. 3, 4, 10, 12, 13, 17, 18, and 19 to be described later. Program information required to make a program display on respective screens is acquired via a network interface 107. A network 108 generally includes broadcast networks such as a cable television network, broadband (high-speed) Internet, satellite network, and the like, or a conventional Internet (low-speed) non-broadcast connection. The program memory 104 may be either a ROM or RAM on which programs are loaded from an external storage device or the like. A data memory 105 stores data generated by various processes.

Assume that the data memory 105 comprises a RAM, which loads data from a nonvolatile external storage medium prior to processing and may be referred to as needed. The bus 106 transfers address signals used to designate respective components to be controlled by the CPU 102, control signals used to control respective components, and data exchanged among respective components.

The arrangement of the outer appearance of a remote controller in the case in which the input unit 101 used to transmit key information to the display control apparatus 100 comprises a remote controller will be described below with reference to FIG. 2.

Figure 2:
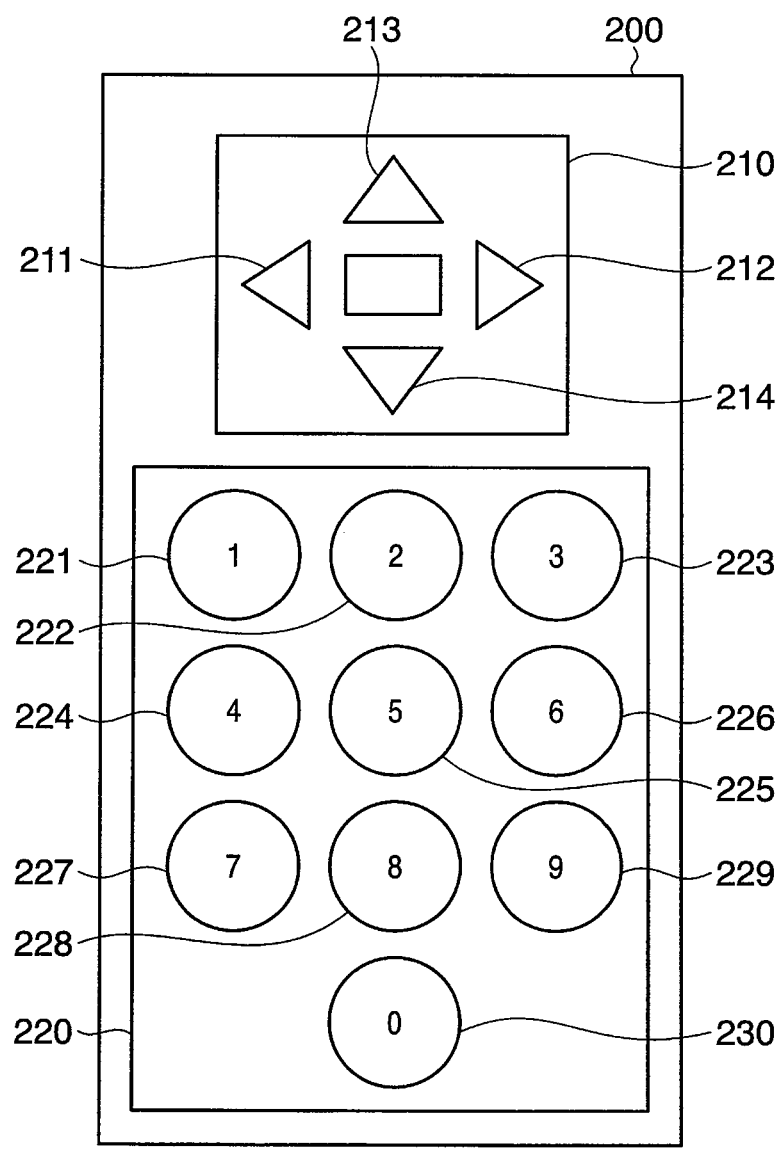
FIG. 2 is a top view showing an example of the arrangement of a remote controller 200 according to one embodiment of the present invention.

Referring to FIG. 2, the remote controller 200 has a cursor keypad 210 and numeric keypad 220. The cursor keypad 210 includes four different direction keys; that is, a right key 212 and left key 211 used to indicate the right-and-left (horizontal) directions, and an up key 213 and down key 214 used to indicate the up-and-down (vertical) directions. The numeric keypad 220 includes 10 different numeric keys 221 to 230 from 0 to 9.

The remote controller 200 is connected to the display control apparatus 100 via a wire or wirelessly, and notifies the CPU 102 of key information based on an operation accepted from the user. This key information includes a key code required to identify the operated key itself, and a key type to which that key belongs, that is, information indicating either the cursor keypad 210 or numeric keypad 220. Upon acquisition of the key information from the remote controller 200 as the input unit 101, the CPU 102 stores that key information as an operation record in the data memory 105.

The display switching operation of an electronic program guide using the remote controller 200 according to this embodiment will be described below.

Figure 3:
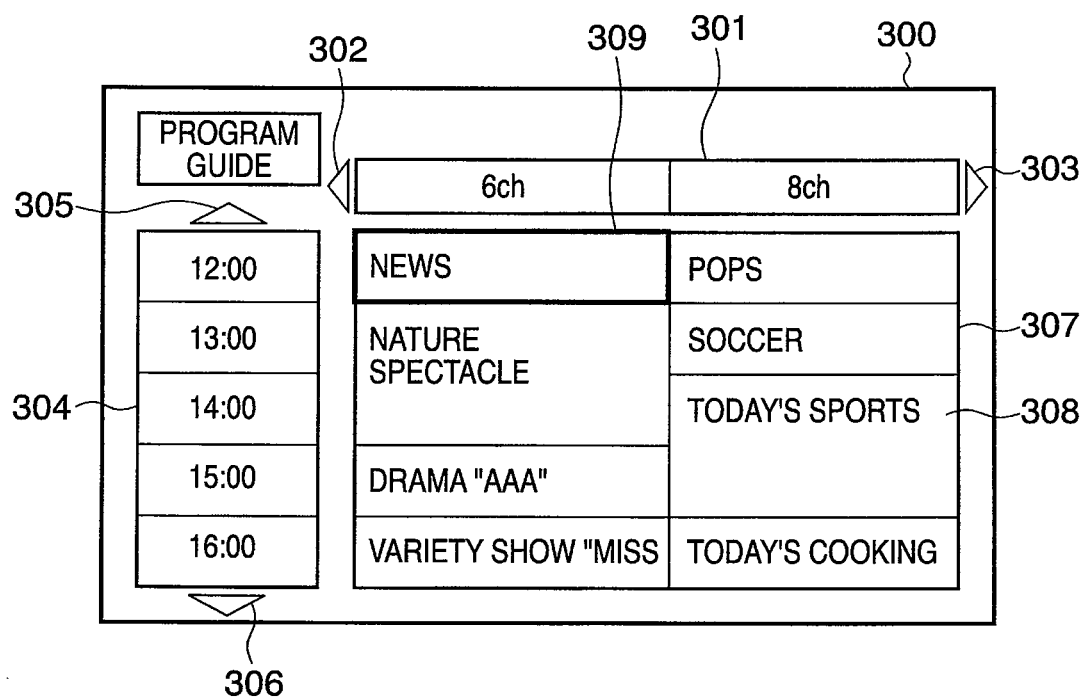
FIG. 3 shows an electronic program guide screen 300 displayed on a display unit 103 according to the first embodiment of the present invention.

FIG. 3 shows an example of an electronic program guide screen displayed on the display unit 103 according to this embodiment. Referring to FIG. 3, a screen 300 indicates the whole electronic program guide display screen, which displays information of programs to be TV-broadcast in the order of broadcast time zones for each of a plurality of channels.

The screen is roughly divided into three areas. An area 301 is used to display channel numbers, and displays "6ch" and "8ch" in FIG. 3. The channel numbers can be switched using the right and left keys 212 and 211 of the cursor keypad 210, and these operations are indicated by arrow marks 303 and 302. An area 304 is used to display the time zones of programs, and displays from "12:00" to "16:00" in increments of one hour in FIG. 3. The time zones can be switched using the up and down keys 213 and 214 of the cursor keypad 210, and these operations are indicated by arrow marks 305 and 306.

Furthermore, an area 307 is used to display respective program names to be broadcast in specific time zones of specific channels, and displays a total of eight program names in FIG. 3. Each program is displayed in a program frame 308 for each broadcast time of a program, and the user can move a cursor 309 as an identification display indicating the selected program by operating the cursor keypad 210. That is, when the user operates the right or left key 212 or 211 of the cursor keypad 210, he or she can move the cursor 309 to a broadcast frame of a different channel to select a desired program. By operating the up or down key 213 or 214, the user can select a program of a different time zone in a single channel.

As described above, FIG. 3 shows an example of the electronic program guide display screen which displays eight programs which will be broadcast on 6ch and 8ch within time zones from "12:00" to "17:00".

Note that the electronic program guide display screen 300 shown in FIG. 3 allows the user to select a program using only the cursor keypad 210. In this case, when the user operates one of the numeric keys 221 to 230 included in the numeric keypad 220, the electronic program guide display screen is switched to a single channel program selection screen shown in FIG. 4.

Figure 4:
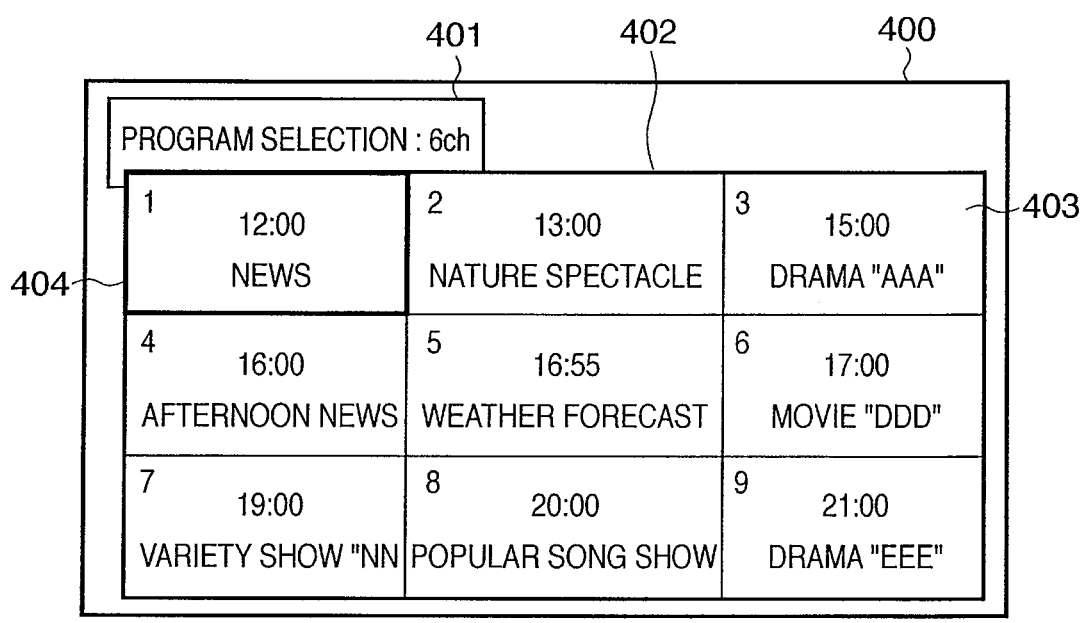
FIG. 4 shows a single channel program selection screen 400 displayed on the display unit 103 according to the first embodiment of the present invention.

FIG. 4 shows an example of a single channel program selection screen displayed on the display unit 103 according to this embodiment. Referring to FIG. 4, a screen 400 indicates a single channel program selection screen, and displays information of programs to be TV-broadcast in the order of broadcast times for a single channel.

In FIG. 4, an area 401 is used to display the number of a channel that will broadcast programs displayed within an area 402, and indicates that "6ch" is selected in FIG. 4. Note that in the case of operation of the numeric keypad 220 with the electronic program guide display 300 shown in FIG. 3, the channel number of a channel displayed in the area 401 corresponds to that of a channel to which program frame 308 at the location of the cursor 309 belongs.

In FIG. 4, the area 402 displays programs, which are scheduled to be broadcast in the selected channel, within program frames 403. The area 402 is divided into nine fields, which are displayed in correspondence with the layout positions of the keys 221 to 229 of the numeric keypad 220 of the remote controller 200. In FIG. 4, the program frames 403 display numbers "1" to "9" indicating the corresponding keys of the numeric keypad 220 in their upper left positions. The respective program frames 403 display program names and the broadcast start times of the programs.

Note that the programs displayed on the area 402 are determined so that a program of the program frame 308 at the location of the cursor 309 upon operation of the numeric keypad 220 on the electronic program guide display screen 300 in FIG. 3 is located at the head (upper left) position of the area 402 that displays the programs. Note that the head position means the position of the program frame 403 that can be selected by the numeric key 221. That is, FIG. 4 shows an example of the single channel program selection screen upon operation of the numeric keypad 220 when the cursor 309 is located at "News" which will be broadcast at "12:00" on "6ch" on the screen 300.

The user can select a desired program by selecting one of the keys 221 to 229 of the numeric keypad 220. The selected program is indicated by a cursor 404.

In this embodiment, the key type used to select a program is assigned to each screen. When the user operates a key of a key type different from the assigned key type, the user interface (UI) on the display unit 103 is switched to another screen. This switching control is done based on rules shown in a table in FIG. 5.

That is, when the user operates the cursor keypad 210, the program guide display screen 300 shown in FIG. 3 is displayed. When he or she operates the numeric keypad 220, the single channel program selection screen 400 shown in FIG. 4 is displayed. In order to prevent screen switching due to an operation error, whether or not to switch the screen may be confirmed by making a key operation of a different type.

The display screen switching processing on the display unit 103 according to this embodiment will be described below with reference to the flowchart of FIG. 6. The processing corresponding to the flowchart of FIG. 6 is implemented when the CPU 102 executes a processing program stored in the program memory 104 shown in FIG. 1.

Figure 6:
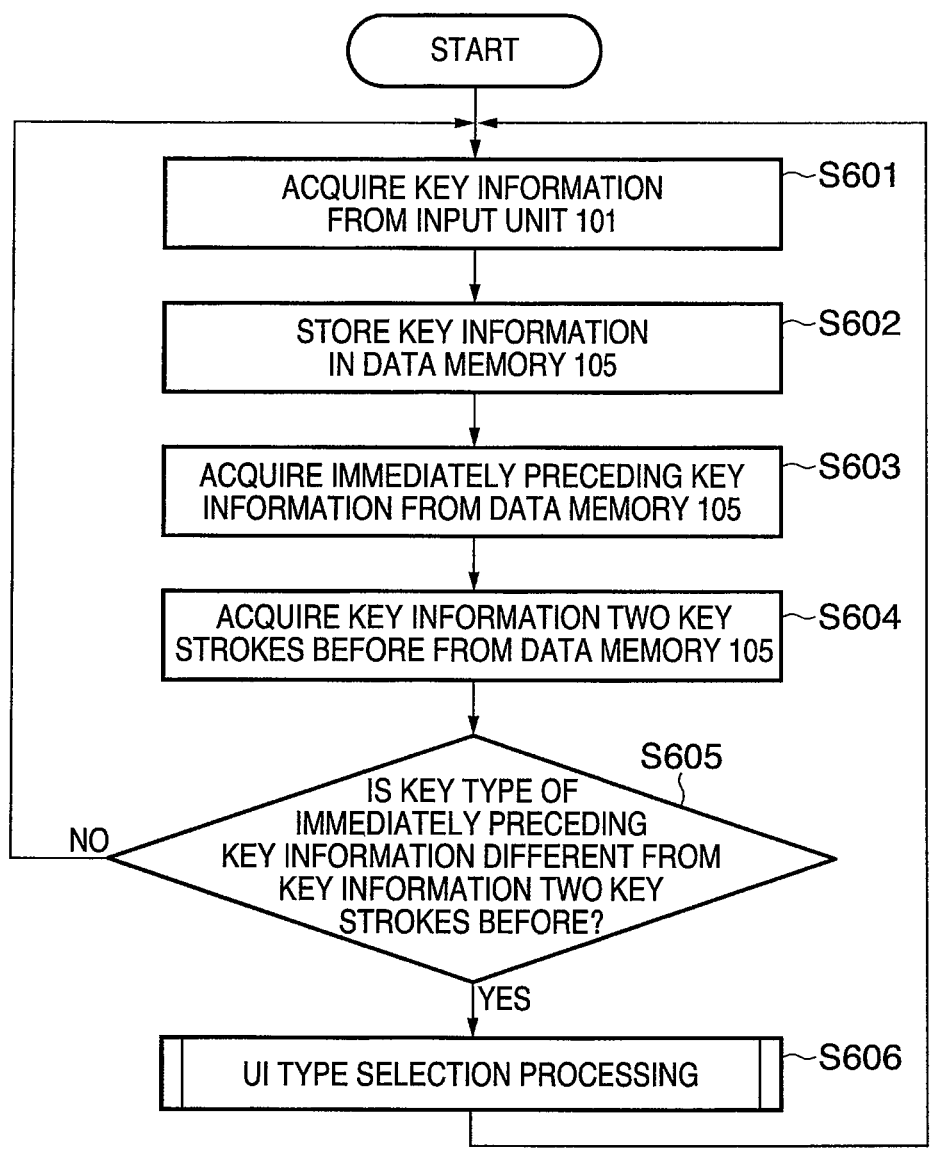
FIG. 6 is a flowchart showing an example of the switching processing of a display screen on the display unit 103 according to the embodiment of the present invention.

Referring to FIG. 6, the CPU 102 acquires key information from the input unit 101 in step S601. The process in this step corresponds to that for acquiring key information from the remote controller 200 when the remote controller accepts a key operation input. The key information includes a key code required to identify the operated key, and a key type to which that key belongs.

In step S602, the CPU 102 saves the acquired key information in the data memory 105. FIG. 8 shows an example of the key information saved in the data memory 105 at that time. FIG. 8 shows an example of the data structure of key information saved in the data memory 105.

As shown in FIG. 8, the data memory 105 saves a key type 801, key code 802, and save time 803 of the key information. The key type field 801 saves information indicating either "cursor key" or "numeric key". The key code field 802 saves information required to identify the operated key itself. In FIG. 8, this field saves "up" indicating the operation of the up key 213, and "1", "2", and "3" indicating the operations of the numeric keys 221 to 223. Note that FIG. 8 describes the key names for the sake of simplicity, but any other formats may be used as long as the information represents a key code. The time field 802 saves a time "11:00:05" at which the key information based on the operation of the up key 213 was registered as the time at which the key information was saved in the data memory 105.

Referring back to FIG. 6, in step S603 the CPU 102 acquires the latest key information (immediately preceding key information) of those stored in the data memory 105. In the case of FIG. 8, the immediately preceding key information is that based on the operation of the up key 213. Furthermore, in step S604 the CPU 102 acquires the key information (key information two keystrokes before) stored in the data memory 105 immediately before the immediately preceding key information from the data memory 105. In case of FIG. 8, the key information two keystrokes before is that based on the operation of the numeric key 221 "1".

In step S605, the CPU 102 compares the key types 801 of the immediately preceding key information and the key information two keystrokes before acquired in steps S603 and S604. If the two key types are the same, for example, if both key types are "cursor key" or "numeric key" ("NO" in step S605), the process returns to step S601 to repeat the processes. On the other hand, if the two key types are different ("YES" in step S605), the process advances to step S606. In the case of FIG. 8, the key types are different when they are respectively "cursor key" and "numeric key". In step S606, the CPU 102 executes UI type selection processing for selecting a UI to be displayed on the display unit 103. After execution of the processing, the process returns to step S601 to repeat the above processes.

Details of the UI type selection processing in step S606 will be described below with reference to the flowchart of FIG. 7. The processing corresponding to the flowchart of FIG. 7 is implemented when the CPU 102 executes a processing program stored in the program memory 104 shown in FIG. 1, as in FIG. 6.

Figure 7:
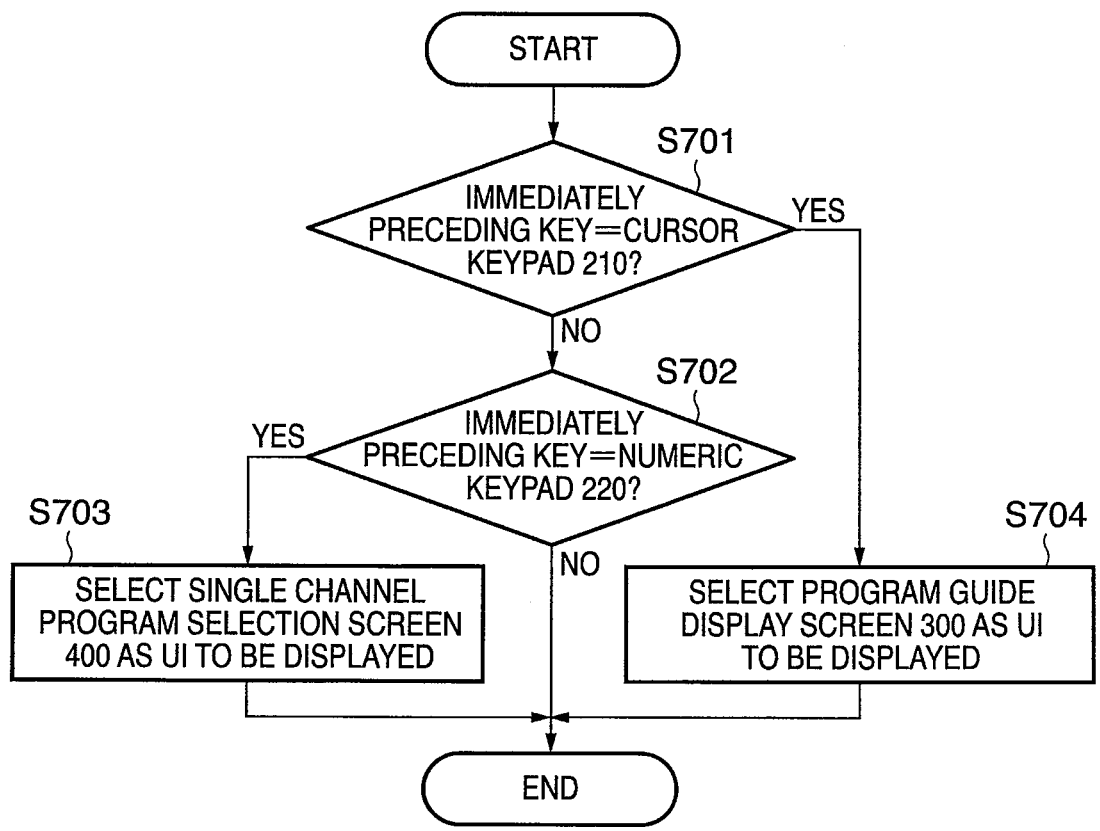
FIG. 7 is a flowchart showing an example of the UI type selection processing according to the first embodiment of the present invention.

Referring to FIG. 7, the CPU 102 checks in step S701 if the key type 801 included in the immediately preceding key information is "cursor key". If the key type 801 is not "cursor key" ("NO" in step S701), the process advances to step S702. The CPU 102 checks in step S702 if the key type 801 included in the immediately preceding key information is "numeric key". If the key type 801 is "numeric key" ("YES" in step S702), the process advances to step S703. On the other hand, if the key type 801 is not "numeric key" ("NO" in step S702), the processing ends. If it is determined in step S701 that the key type 801 is "cursor key" ("YES" in step S701), the process advances to step S704.

In step S703, the CPU 102 selects the single channel program selection screen 400 shown in FIG. 4 as the UI to be displayed, and displays the corresponding screen on the display unit 103, thus ending the processing. In step S704, the CPU 102 selects the program guide display screen 300 shown in FIG. 3 as the UI to be displayed, and displays the corresponding screen on the display unit 103, thus ending the processing. In case of FIG. 8, since the key type 801 of the immediately preceding key is "cursor key", the process advances to step S704 to display the program guide display screen 300 shown in FIG. 3.

Note that the key information saved in the data memory 105 can include information associated with a key in addition to the key type 801 and key code 802. As the key information, data that can identify a key difference may be used in place of the key type 801 and key code 802.

As described above, according to this embodiment, the following effects can be achieved. Since different user interfaces can be used for identical selection targets (programs), the user is not restrained by a specific user interface upon making program selection. Also, since different user interfaces can achieve an identical operation goal, the user can use a user interface of his or her choice. Hence, the user can intuitively operate the user interface.

Second Embodiment

The second embodiment of the present invention will be described hereinafter. Since the arrangements of the display control apparatus 100 and remote controller 200 are the same as those in the first embodiment, a repetitive description thereof will be avoided.

In the aforementioned first embodiment, the UI type is selected based only on the key type difference of the key information stored in the data memory 105. In this embodiment, the UI type to be displayed is selected further with reference to the key code.

Figure 10:
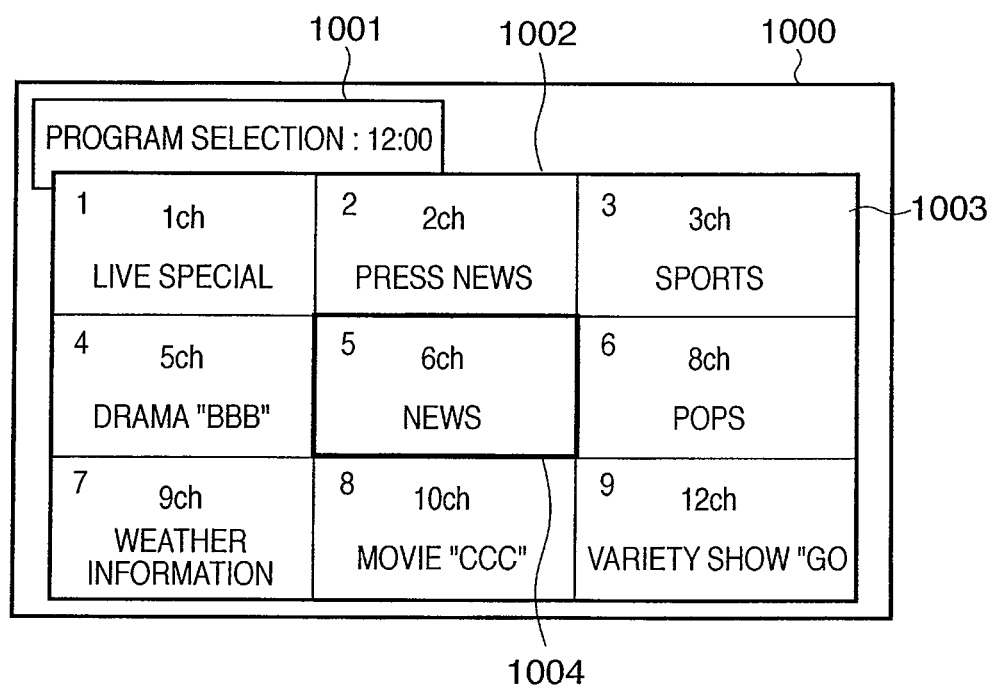
FIG. 10 shows a single time zone program selection screen 1000 displayed on the display unit 103 according to the second embodiment of the present invention.

In this embodiment, as shown in the correspondence table in FIG. 9, UI types are selected according to the conditions satisfied by the operation record when the key type of the operation key operated on the remote controller 200 is changed. More specifically, when the user operates the cursor keypad 210, the program guide display screen 300 shown in FIG. 3 is displayed. When the user operated the right or left key 212 or 211 of the cursor keypad 210 immediately before he or she operates the numeric keypad 220, a single time zone program selection screen 1000 shown in FIG. 10 is selected. Furthermore, when the user operated the up or down key 213 or 214 of the cursor keypad 210 immediately before that operation, the single channel program selection screen 400 shown in FIG. 4 is displayed.

FIG. 10 shows an example of the single time zone program selection screen displayed on the display unit 103 according to this embodiment. Referring to FIG. 10, the screen 1000 indicates a whole single time zone program selection screen, and displays information of programs which are to be TV-broadcast in plural channels within a single time zone.

In FIG. 10, an area 1001 displays a time zone within which programs displayed on an area 1002 will be broadcast, and FIG. 10 indicates that "12:00" is selected. Note that the time zone indicated by the area 1001 corresponds to that to which the program frame 308 at the location of the cursor 309 belongs upon operation of the numeric keypad 220 on the electronic program guide display screen 300 in FIG. 3. That is, FIG. 10 shows the single time zone program selection screen upon operation of the numeric keypad 220 when the cursor 309 is located at a program to be broadcast within the time zone "12:00".

In FIG. 10, the area 1002 displays programs which are scheduled to be broadcast within the selected time zone, using program frames 1003. The area 1002 is divided into nine fields, which are displayed in correspondence with the layout positions of the keys 221 to 229 of the numeric keypad 220 of the remote controller 200. In FIG. 10, the respective program frames 1003 display numbers "1" to "9" indicating the corresponding keys of the numeric keypad 220 in their upper left positions. The respective program frames 1003 display channel names and program names.

Note that the programs displayed on the area 1002 are determined so that a program of the program frame 308 at the location of the cursor 309 upon operation of the numeric keypad 220 on the electronic program guide display screen 300 in FIG. 3 is located at the center of the area 1002 that displays the programs. The center position means a position of a program frame 1003 which can be selected by the numeric key 225. That is, FIG. 10 shows an example of the single time zone program selection screen upon operation of the numeric keypad 220 when the cursor 309 is located at "News" which will be broadcast at "12:00" on "6ch" on the screen 300.

The user can select a desired program by selecting one of the keys 221 to 229 of the numeric keypad 220. The selected program is indicated by a cursor 1004.

Since the screens of FIGS. 3 and 4 have been explained in the first embodiment, a repetitive description thereof will be avoided in this embodiment.

The overall sequence of the display screen switching processing on the display unit 103 of this embodiment is the same as that in the flowchart shown in FIG. 6 of the first embodiment. However, details of the UI type selection processing in step S606 is different from the first embodiment.

Figure 11:
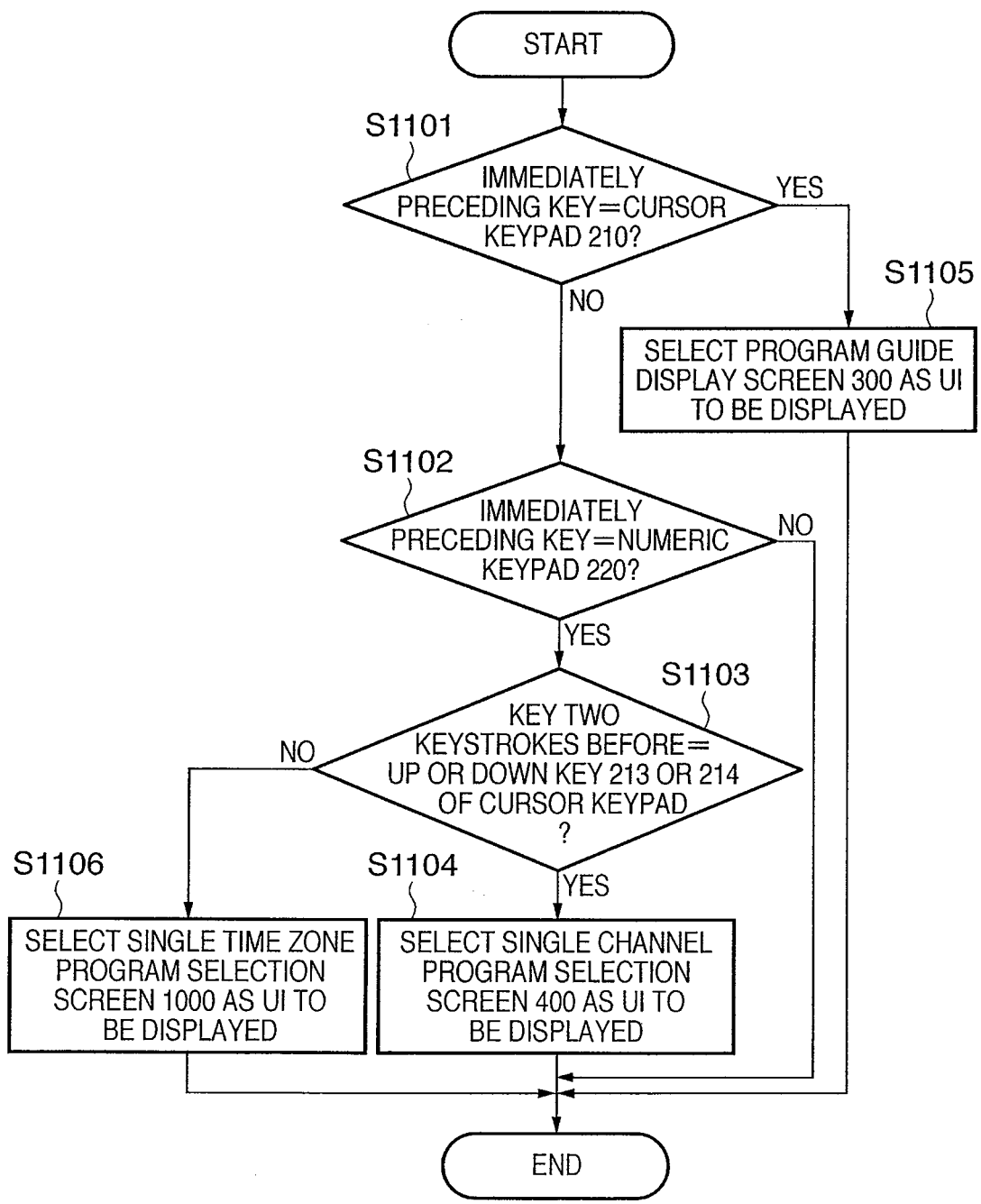
FIG. 11 is a flowchart showing an example of the UI type selection processing according to the second embodiment of the present invention.

The UI type selection processing according to this embodiment will be described below with reference to the flowchart of FIG. 11. FIG. 11 is a flowchart showing an example of the UI type selection processing according to this embodiment. The processing corresponding to the flowchart of FIG. 11 is implemented when the CPU 102 executes a processing program stored in the program memory 104 shown in FIG. 1.

Referring to FIG. 11, the CPU 102 checks in step S1101 if the key type 801 included in the immediately preceding key information is "cursor key". If the key type 801 is not "cursor key" ("NO" in step S1101), the process advances to step S1102. The CPU 102 checks in step S1102 if the key type 801 included in the immediately preceding key information is "numeric key". If the key type 801 is "numeric key" ("YES" in step S1102), the process advances to step S1103. On the other hand, if the key type 801 is not "numeric key" ("NO" in step S1102), the processing ends.

The CPU 102 checks in step S1103 if the key code 802 included in the key information two keystrokes before is "up key" or "down key". If the key code 802 is "up key" or "down key" ("YES" in step S1103), the process advances to step S1104. On the other hand, if the key code 802 is neither "up key" nor "down key", i.e., "right key" or "left key" ("NO" in step S1103), the process advances to step S1106.

If it is determined in step S1101 that the key type 801 is "cursor key" ("YES" in step S1101), the process advances to step S1105.

In step S1104, the CPU 102 selects the single channel program selection screen 400 shown in FIG. 4 as a UI to be displayed, and displays the corresponding screen on the display unit 103, thus ending the processing. In step S1105, the CPU 102 selects the program guide display screen 300 shown in FIG. 3 as a UI to be displayed, and displays the corresponding screen on the display unit 103, thus ending the processing. Furthermore, in step S1106, the CPU 102 selects the single time zone program selection screen 1000 shown in FIG. 10 as a UI to be displayed, and displays the corresponding screen on the display unit 103, thus ending the processing. In case of FIG. 8, since the key type 801 of the immediately preceding key is "cursor key", the process advances to step S1105 to display the program guide display screen shown in FIG. 3.

In this embodiment, as shown in FIG. 9, the screen in FIG. 3 is switched to that in FIG. 10 under the condition that the user operated the right or left key at the last minute. The operation of the right or left key is made to switch programs within a single time zone, and switching to the UI that displays a program list included in a desired time zone is also convenient for the user, thus enhancing the efficiency of program selection.

Third Embodiment

The third embodiment of the present invention will be described hereinafter. Since the arrangements of the display control apparatus 100 and remote controller 200 are the same as those in the first embodiment, a repetitive description thereof will be avoided.

In the aforementioned second embodiment, the UI type is selected with reference to the key type and key code of the key information stored in the data memory 105. By contrast, in this embodiment, different UIs of an identical UI type but of different display states can be selected based on the key code.

In this embodiment, as shown in the correspondence table in FIG. 14, UI types and display modes are selected according to the conditions satisfied by the operation record when the key type of the operation key operated on the remote controller 200 is changed.

Figure 13:
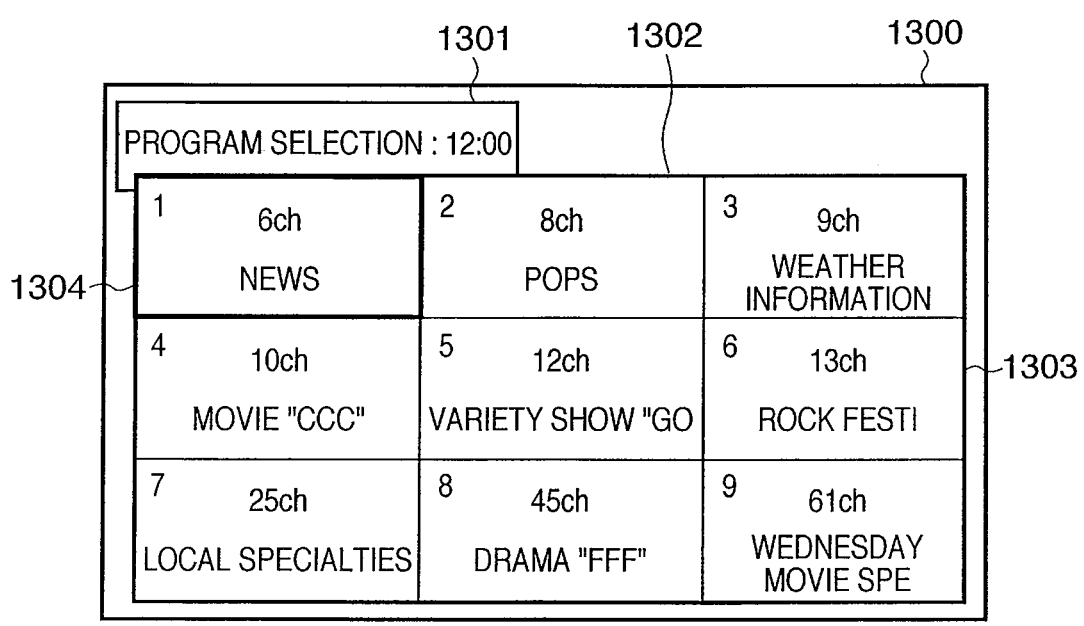
FIG. 13 shows a single time zone program selection screen 1300 displayed on the display unit 103 according to the third embodiment of the present invention.

More specifically, when the user operates the cursor keypad 210, the program guide display screen 300 shown in FIG. 3 is displayed. When the user operated the left key 211 of the cursor keypad 210 immediately before he or she operates the numeric keypad 220, the single time zone program selection screen 1000 shown in FIG. 10 is selected. Furthermore, when the user operated the right key 212 of the cursor keypad 210 immediately before that operation, a single time zone program selection screen 1300 shown in FIG. 13 is displayed.

Figure 12:
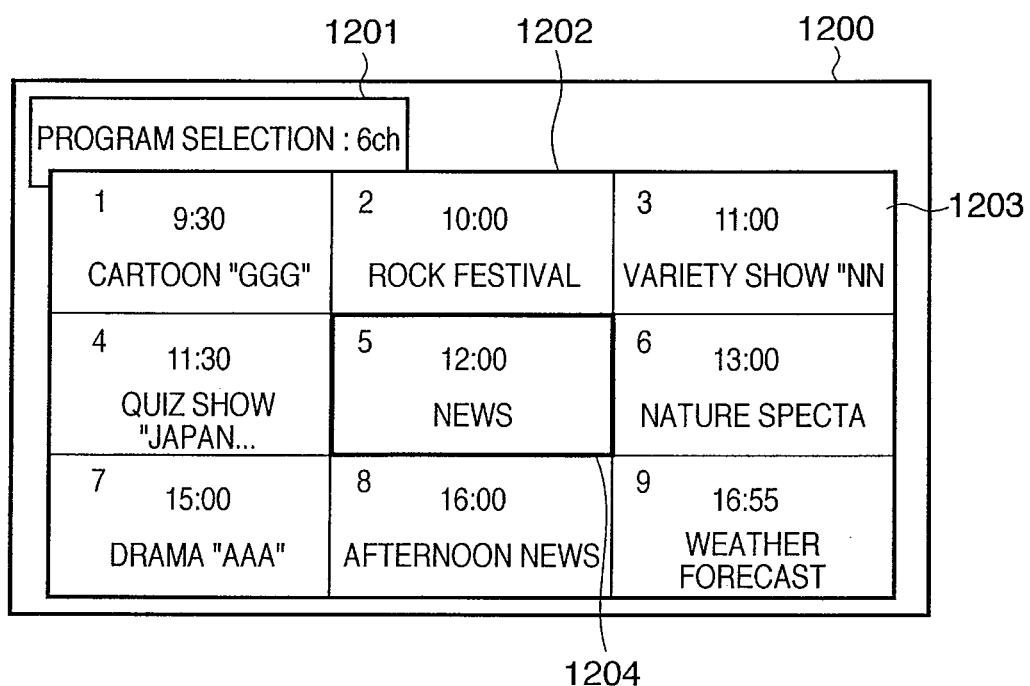
FIG. 12 shows a single channel program selection screen 1200 displayed on the display unit 103 according to the third embodiment of the present invention.

Moreover, when the user operated the up key 213 of the cursor keypad 210 immediately before he or she operates the numeric keypad 220, a single channel program selection screen 1200 shown in FIG. 12 is displayed. In addition, when the user operated the down key 214 of the cursor keypad 210 immediately before that operation, the single channel program selection screen 400 shown in FIG. 4 is displayed.

FIG. 12 shows an example of the single channel program selection screen displayed on the display unit 103 according to this embodiment. Referring to FIG. 12, the screen 1200 indicates the whole single channel program selection screen.

In FIG. 12, an area 1201 is used to display the number of a channel that will broadcast programs displayed within an area 1202, and indicates that "6ch" is selected in FIG. 12. Note that the number of a channel displayed in the area 1201 corresponds to that of a channel, to which the program frame 308 at the location of the cursor 309 belongs, upon operation of the numeric keypad 220 on the electronic program guide display screen 300 shown in FIG. 3.

In FIG. 12, the area 1202 displays programs, which are scheduled to be broadcast in the selected channel, within program frames 1203. The area 1202 is divided into nine fields, which are displayed in correspondence with the layout positions of the keys 221 to 229 of the numeric keypad 220 of the remote controller 200. In FIG. 12, the program frames 1203 display numbers "1" to "9" indicating the corresponding keys of the numeric keypad 220 in their upper left positions. The respective program frames 1203 display program names and the broadcast start times of the programs.

Note that the programs displayed on the area 1202 are determined so that a program of the program frame 308 at the location of the cursor 309 upon operation of the numeric keypad 220 on the electronic program guide display screen 300 in FIG. 3 is located at the center of the area 1202 that displays the programs. Note that the center position means the position of the program frame 1203 that can be selected by the numeric key 225. That is, FIG. 12 shows an example of the single channel program selection screen upon operation of the numeric keypad 220 when the cursor 309 is located at "News" which will be broadcast at "12:00" on "6ch" on the screen 300.

The user can select a desired program by selecting one of the keys 221 to 229 of the numeric keypad 220. The selected program is indicated by a cursor 1204.

FIG. 13 shows an example of the single time zone program selection screen displayed on the display unit 103 according to this embodiment. Referring to FIG. 13, the screen 1300 indicates the whole single time zone program selection screen.

In FIG. 13, an area 1301 displays a time zone within which programs displayed on an area 1302 will be broadcast, and FIG. 13 indicates that "12:00" is selected. Note that the time zone indicated by the area 1301 corresponds to that to which the program frame 308 at the location of the cursor 309 belongs upon operation of the numeric keypad 220 on the electronic program guide display screen 300 in FIG. 3.

In FIG. 13, the area 1302 displays programs which are scheduled to be broadcast within the selected time zone, using program frames 1303. The area 1302 is divided into nine fields, which are displayed in correspondence with the layout positions of the keys 221 to 229 of the numeric keypad 220 of the remote controller 200. In FIG. 13, the respective program frames 1303 display numbers "1" to "9" indicating the corresponding keys of the numeric keypad 220 in their upper left positions. The respective program frames 1303 display channel names and program names.

Note that the programs displayed on the area 1302 are determined so that a program of the program frame 308 at the location of the cursor 309 upon operation of the numeric keypad 220 on the electronic program guide display screen 300 in FIG. 3 is located at the head (upper left) position of the area 1302 that displays the programs. The head position means the position of a program frame 1303 which can be selected by the numeric key 221. That is, FIG. 13 shows an example of the single time zone program selection screen upon operation of the numeric keypad 220 when the cursor 309 is located at "News" which will be broadcast at "12:00" on "6ch" on the screen 300.

The user can select a desired program by selecting one of the keys 221 to 229 of the numeric keypad 220. The selected program is indicated by a cursor 1304.

Since the screens of FIGS. 3, 4, and 10 have been explained in the first or second embodiments, a repetitive description thereof will be avoided in this embodiment.

The overall sequence of the display screen switching processing on the display unit 103 of this embodiment is the same as that in the flowchart shown in FIG. 6 of the first embodiment. However, details of the UI type selection processing in step S606 is different from the first embodiment.

Figure 15:
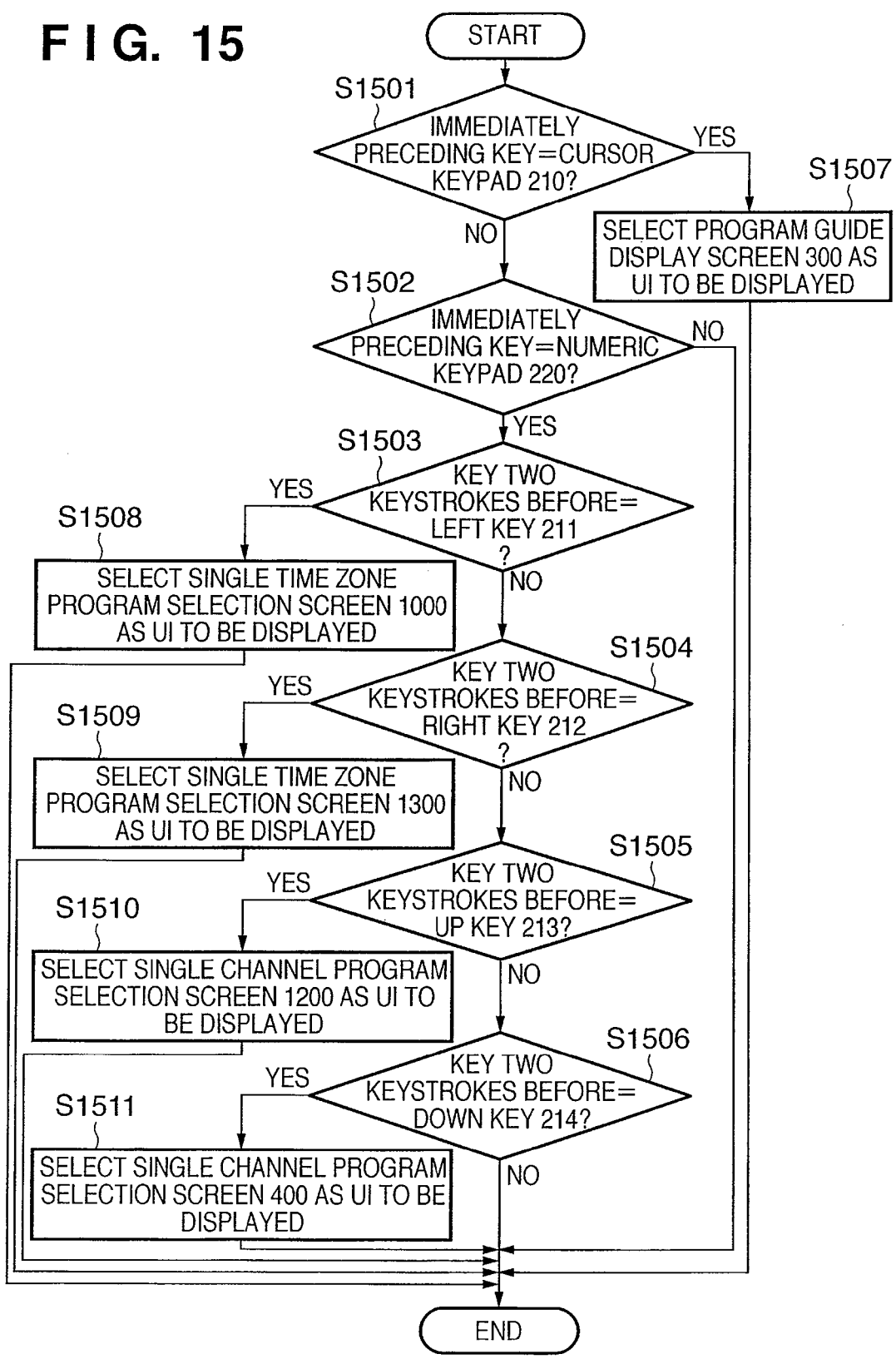
FIG. 15 is a flowchart showing an example of the UI type selection processing according to the third embodiment of the present invention.

The UI type selection processing according to this embodiment will be described below with reference to the flowchart of FIG. 15. FIG. 15 is a flowchart showing an example of the UI type selection processing according to this embodiment. The processing corresponding to the flowchart of FIG. 15 is implemented when the CPU 102 executes a processing program stored in the program memory 104 shown in FIG. 1, as in FIG. 6.

Referring to FIG. 15, the CPU 102 checks in step S1501 if the key type 801 included in the immediately preceding key information is "cursor key". If the key type 801 is not "cursor key" ("NO" in step S1501), the process advances to step S1502. The CPU 102 checks in step S1502 if the key type 801 included in the immediately preceding key information is "numeric key". If the key type 801 is "numeric key" ("YES" in step S1502), the process advances to step S1503. On the other hand, if the key type 801 is not "numeric key" ("NO" in step S1502), the processing ends.

The CPU 102 checks in step S1503 if the key code 802 included in the key information two keystrokes before is "left key". If the key code 802 is "left key" ("YES" in step S1503), the process advances to step S1508. On the other hand, if the key code 802 is not "left key" ("NO" in step S1503), the process advances to step S1504.

The CPU 102 checks in step S1504 if the key code 802 included in the key information two keystrokes before is "right key". If the key code 802 is "right key" ("YES" in step S1504), the process advances to step S1509. On the other hand, if the key code 802 is not "right key" ("NO" in step S1504), the process advances to step S1505.

The CPU 102 checks in step S1505 if the key code 802 included in the key information two keystrokes before is "up key". If the key code 802 is "up key" ("YES" in step S1505), the process advances to step S1510. On the other hand, if the key code 802 is not "up key" ("NO" in step S1505), the process advances to step S1506.

The CPU 102 checks in step S1506 if the key code 802 included in the key information two keystrokes before is "down key". If the key code 802 is "down key" ("YES" in step S1506), the process advances to step S1511. On the other hand, if the key code 802 is not "down key" ("NO" in step S1506), the process ends.

If it is determined in step S1501 that the key type 801 is "cursor key" ("YES" in step S1501), the process advances to step S1507. In step S1507, the CPU 102 selects the program guide display screen 300 shown in FIG. 3 as a UI to be displayed, and displays the corresponding screen on the display unit 103, thus ending the processing.

In step S1508, the CPU 102 selects the single time zone program selection screen 1000 shown in FIG. 10 as a UI to be displayed, and displays the corresponding screen on the display unit 103, thus ending the processing. In step S1509, the CPU 102 selects the single time zone program selection screen 1300 shown in FIG. 13 as a UI to be displayed, and displays the corresponding screen on the display unit 103, thus ending the processing.

In step S1510, the CPU 102 selects the single channel program selection screen 1200 shown in FIG. 12 as a UI to be displayed, and displays the corresponding screen on the display unit 103, thus ending the processing. In step S1511, the CPU 102 selects the single channel program selection screen 400 shown in FIG. 4 as a UI to be displayed, and displays the corresponding screen on the display unit 103, thus ending the processing.

In case of FIG. 8, since the key type 801 of the immediately preceding key is "cursor key", the process advances to step S1507 to display the program guide display screen shown in FIG. 3.

As described above, according to this embodiment, UIs of an identical UI type but of different display states can be selected according to the operation of the remote controller 200.

Fourth Embodiment

The fourth embodiment of the present invention will be described hereinafter. Since the arrangements of the display control apparatus 100 and remote controller 200 are the same as those in the first embodiment, a repetitive description thereof will be avoided.

In the first to third embodiments, when the user operates the cursor keypad 210 as the key type, the program guide display screen 300 is merely displayed irrespective of the immediately preceding key operation. By contrast, this embodiment allows the user to select program guide display screens of an identical UI type but of different display states based on the key code of a key operated immediately before the cursor keypad 210.

In this embodiment, as shown in the correspondence table in FIG. 16, UI types and display modes are selected according to the conditions satisfied by the operation record when the key type of the operation key operated on the remote controller 200 is changed.

Figure 17:
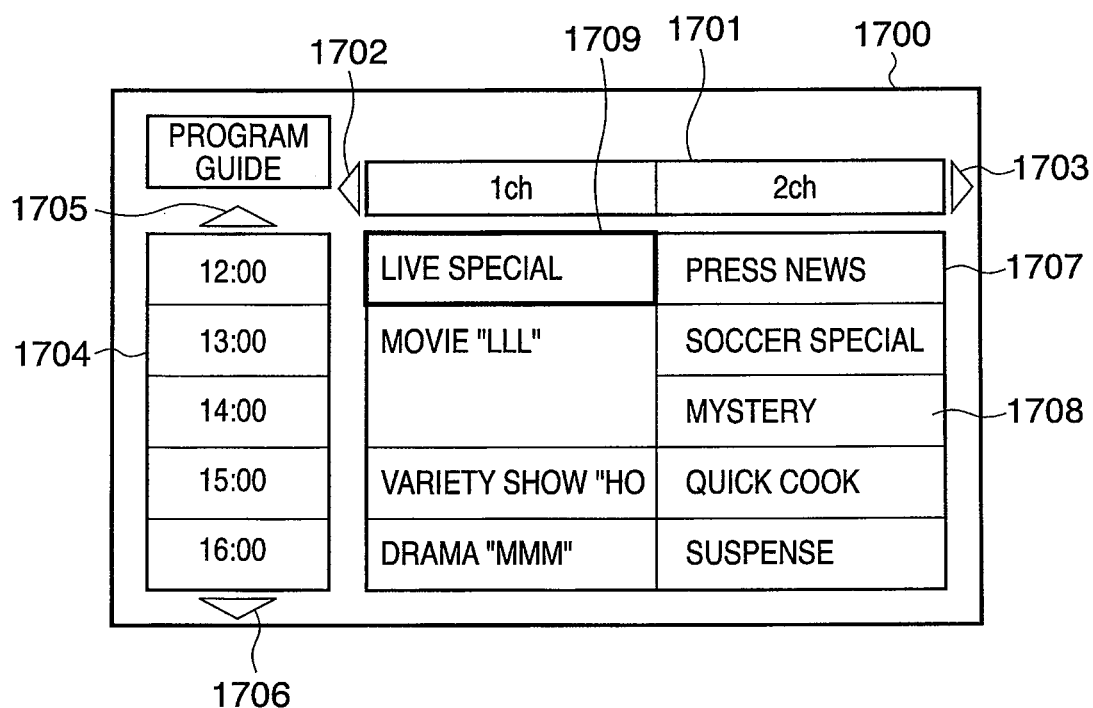
FIG. 17 shows an electronic program guide display screen 1700 according to the fourth embodiment of the present invention.
Figure 18:
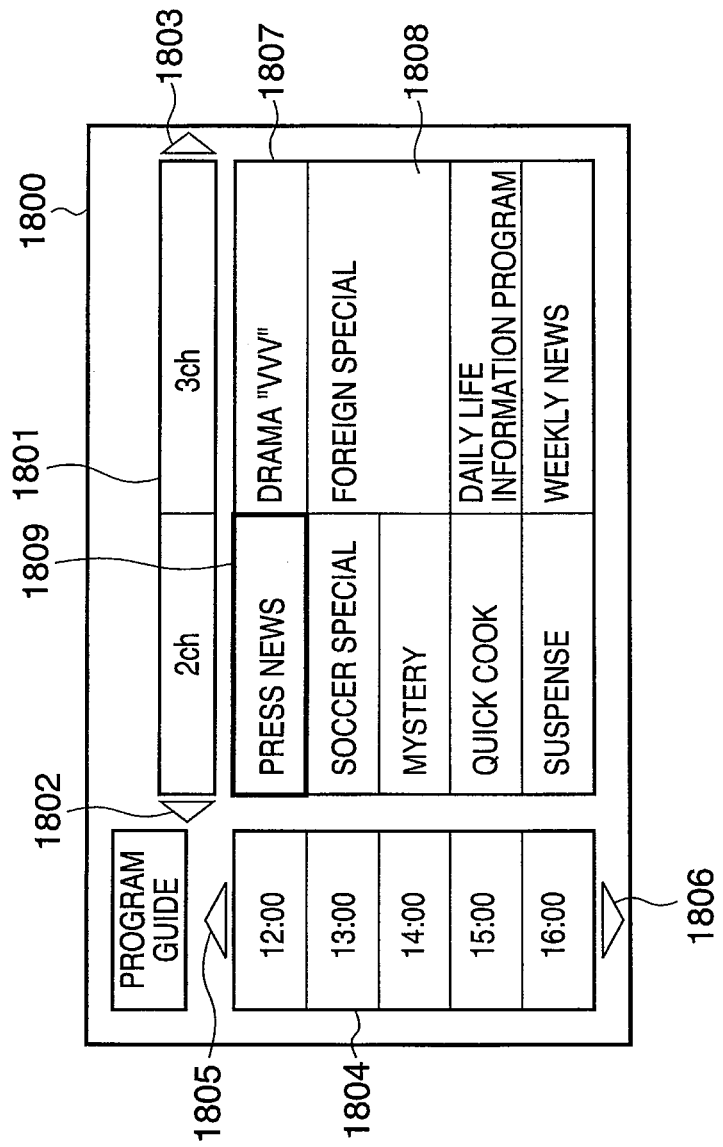
FIG. 18 shows an electronic program guide display screen 1800 according to the fourth embodiment of the present invention.
Figure 19:
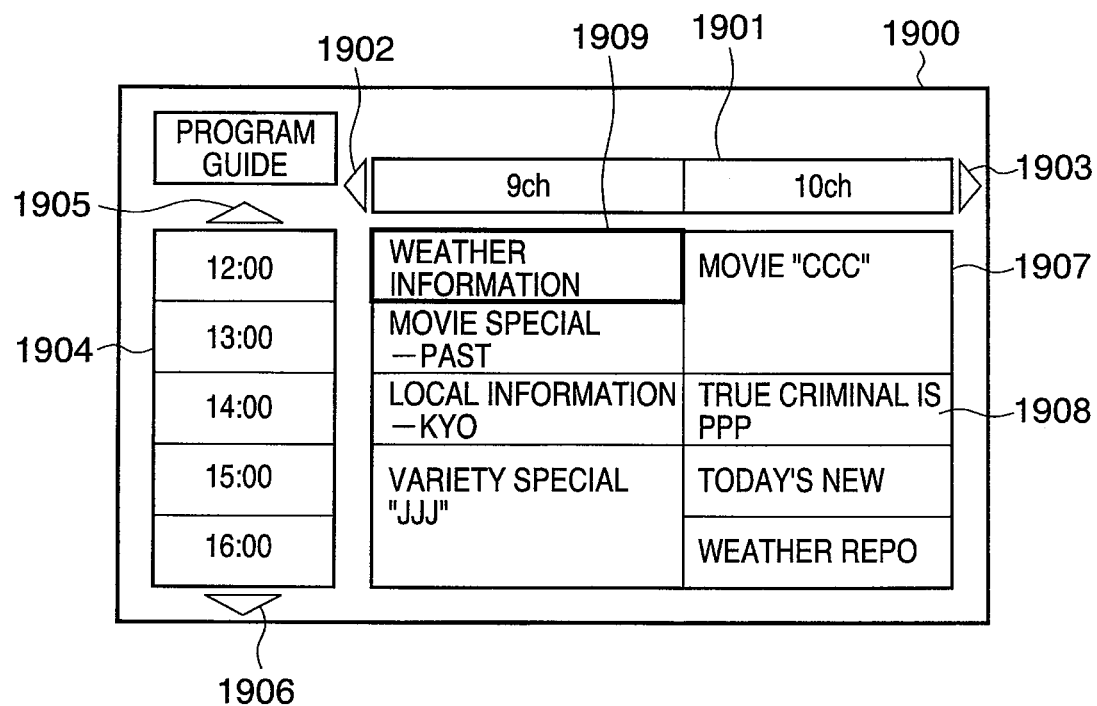
FIG. 19 shows an electronic program guide display screen 1900 according to the fourth embodiment of the present invention.

More specifically, when the user had operated the key 221 ("1") of the numeric keypad 220 immediately before he or she operated the cursor keypad 210, a program guide display screen 1700 shown in FIG. 17 is displayed. When the user had operated the key 222 ("2") of the numeric keypad 220 immediately before operating the cursor keypad 210, a program guide display screen 1800 shown in FIG. 18 is displayed. Likewise, when the user had operated one of the keys 223 to 229 ("3" to "9") of the numeric keypad 220 immediately before operating the cursor keypad 210, a program guide display screen corresponding to the operated key is displayed. FIG. 19 shows a program guide display screen 1900 upon operation of the key 229 ("9").

Since the display modes when the user had operated the cursor keypad 210 immediately before he or she operated the numeric keypad 220 are the same as that in the third embodiment, a repetitive description thereof will be avoided.

FIG. 17 shows an example of an electronic program guide screen displayed on the display unit 103 according to this embodiment. Referring to FIG. 17, the screen 1700 indicates the whole electronic program guide display screen.

The configuration of the electronic program guide display screen 1700 is the same as that of the screen 1700 shown in FIG. 3. That is, the screen 1700 is roughly divided into three areas. An area 1701 is used to display channel numbers, and displays "1ch" and "2ch" in FIG. 17. The channel numbers can be switched using the right and left keys 212 and 211 of the cursor keypad 210, and these operations are indicated by arrow marks 1703 and 1702. An area 1704 is used to display time zones of programs, and displays from "12:00" to "16:00" in increments of one hour in FIG. 17. The time zones can be switched using the up and down keys 213 and 214 of the cursor keypad 210, and these operations are indicated by arrow marks 1705 and 1706.

Furthermore, an area 1707 is used to display respective program names to be broadcast in specific time zones of specific channels, and displays a total of nine program names in FIG. 17. Each program is displayed in a program frame 1708 for each broadcast time of a program, and the user can move a cursor 1709 indicating the selected program by operating the cursor keypad 210. That is, when the user operates the right or left key 212 or 211 of the cursor keypad 210, he or she can move the cursor 1709 to a broadcast frame of a different channel to select a desired program. Upon operating the up or down key 213 or 214, the user can select a program of a different time zone in a single channel.

As described above, FIG. 17 shows an example of the electronic program guide display screen 1700 which displays nine programs which will be broadcast on 1ch and 1ch within time zones from "12:00" to "17:00".

Note that the electronic program guide display screen 1700 shown in FIG. 17 is a screen displayed when the user operates the cursor keypad 210 immediately after the operation of key 221 ("1") on the single channel program selection screen 400 or single time zone program selection screen 1000. In this embodiment, the cursor 1709 is displayed on a program of the channel corresponding to the operated key of the numeric keypad 220. Therefore, upon operation of the key 221 ("1"), the cursor 1709 is displayed on the program of "1ch".

FIGS. 18 and 19 show the program guide display screens 1800 and 1900 when the user operates the cursor keypad 210 after the operation of the key 222 ("2") and the key 229 ("9"). On the program guide display screen 1800, a cursor 1809 is displayed on a program of "2ch" based on the operation of the key 222 ("2"). Also, on the program guide display screen 1900, a cursor 1909 is displayed on a program of "9ch" based on the operation of the key 229 ("9"). Since other basic configurations of the screens are the same as those in FIG. 17, a repetitive description thereof will be avoided.

In the same manner as described above, when the user operates the cursor keypad 210 after the operation of the key of the numeric keypad 220 other than the keys "1", "2", and "9" thereof, a cursor is displayed on a program of the channel corresponding to the number of the operated key of the numeric keypad 220. If there is no channel that matches the operated key of the numeric keypad 220, a channel of the number closest to the number of the operated key of the numeric keypad 220 is selected. If there are two or more channels with closest numbers, a channel with either a larger or smaller number may be selected.

The overall sequence of the display screen switching processing on the display unit 103 of this embodiment is the same as that in the flowchart shown in FIG. 6 of the first embodiment. However, details of the UI type selection processing in step S606 are different from the first embodiment.

The UI type selection processing according to this embodiment will be described below with reference to the flowchart of FIG. 20. FIG. 20 is a flowchart showing an example of the UI type selection processing according to this embodiment. The processing corresponding to the flowchart of FIG. 20 is implemented when the CPU 102 executes a processing program stored in the program memory 104 shown in FIG. 1.

Referring to FIG. 20, the CPU 102 checks in step S2001 if the key type 801 included in the immediately preceding key information is "cursor key". If the key type 801 is not "cursor key" ("NO" in step S2001), the process advances to step S2002. The processes in steps S2002 to S2010 are the same as those in steps S1502 to S1506 and S1508 to S1511 in FIG. 15, a repetitive description thereof will be avoided in this embodiment.

If it is determined in step S2001 that the key type 801 is "cursor key" ("YES" in step S2001), the process advances to step S2011. The CPU 102 checks in step S2011 if the key code 802 included in the key information two keystrokes before is "1". If the key code 802 is "1" ("YES" in step S2011), the process advances to step S2014. In step S2014, the CPU 102 selects the program guide display screen 1700 shown in FIG. 17 as a UI to be displayed, and displays the corresponding screen on the display unit 103, thus ending the processing.

On the other hand, if the key code 802 is not "1" ("NO" in step S2011), the process advances to step S2012. The CPU 102 checks in step S2012 if the key code 802 included in the key information two keystrokes before is "2". If the key code 802 is "2" ("YES" in step S2012), the process advances to step S2015. In step S2015, the CPU 102 selects the program guide display screen 1800 shown in FIG. 18 as a UI to be displayed, and displays the corresponding screen on the display unit 103, thus ending the processing. On the other hand, if the key code 802 is not "2" ("NO" in step S2012), the process advances to the next step.

After that, the CPU 102 checks in turn if the key code 802 is any of "3", "4", "5", "6", "7", and "8". If the key code 802 matches one of these numeric values, the process advances to the step of displaying the corresponding program guide display screen. If the key code 802 matches none of these numeric values, the CPU 102 checks in step S2013 if the key code 802 included in the key information two keystrokes before is "9". If the key code 802 is "9" ("YES" in step SS2013), the process advances to step S2016. On the other hand, if the key code 802 is not "9" ("NO" in step S2013), the processing ends.

As described above, according to this embodiment, the program guide display screen including a desired channel can be displayed in accordance with the operation of the remote controller 200.

Other Embodiments

In each of the above embodiments, the input unit 101 has been exemplified by the remote controller 200 which has the cursor keypad 210 and numeric keypad 220 as the user interface. However, the kinds of key types and the number of types of the input unit 101 are not limited to them. For example, the user interface of the remote controller 200 may include alphabet keys, a wheel, jog dial, and the like in addition to or in place of the cursor keypad 210 and numeric keypad 220.

In each of the above embodiments, the "immediately preceding key information" and "key information two keystrokes before" are used. However, the operation record to be used and the number of times of key operations are not limited to them. For example, "pressing of the right or left key of the cursor keypad three times" or "pressing of keys "1", "2", and "3" of the numeric keypad in turn" may be used.

Each of the above embodiments has been explained in association with the screen of a UI used to record TV broadcasting. However, the present invention may be applied to UI screens of software programs such as various applications, an operating system, and the like of PCs or embedded devices other than TV broadcasting recording. In this case, the next UI of software to be displayed may be selected based on the key type or the combination of the key type and operation record. In such case, contents such as a file, image, moving image, music, and the like may be selected in place of a TV broadcasting program.

Furthermore, the present invention may be achieved by combining the aforementioned embodiments. In this way, according to the present invention exemplified by each of the above embodiments, the following effects can be realized.

Since different user interfaces can be used for identical selection targets, the user is not restrained by a specific user interface. By changing the contents that the user can operate according to the key input states, the operability of the user interface can be improved. Since different user interfaces can achieve identical operation goals, the user can use a user interface of his or her choice. Hence, the user can intuitively operate the user interface.

A PC may execute the functions of the embodiments of the present invention based on an externally installed program. In this case, the present invention can be applied to a case wherein an information group including the program is supplied, to a display apparatus, from a storage medium such as a CD-ROM, flash memory, FD, or the like, or from an external storage medium via a network.

A storage medium which records a program code of software that implements the functions of the aforementioned embodiments may be supplied to a system or apparatus. In this case, the objects of the present invention are achieved when a computer (or a CPU or MPU) reads out the program code stored in the storage medium and executes the readout program code.

In this case, the program code itself read out from the storage medium implements the novel functions of the present invention, and the storage medium which stores the program code constitutes the present invention.

As a storage medium used to supply the program code, the following media may be used: a hard disk, optical disk, magneto-optical disk, CD-ROM, CD-R, DVD-ROM, magnetic tape, nonvolatile memory card, ROM, EEPROM, silicon disk, and the like.

The functions of the aforementioned embodiments are implemented not only when the computer executes the readout program code. The functions of the aforementioned embodiments are also implemented by some or all of actual processes executed by an OS (operating system), which runs on the computer, based on the support of this program code.

Furthermore, the program code read out from the storage medium may often be written in a memory equipped on a function expansion board or function expansion unit, which is inserted in or connected to the computer. The functions of the aforementioned embodiments are also implemented by some or all actual processes executed by a CPU equipped on the function expansion board or unit after the program code is loaded.

The present invention can be applied to either a system consisting of a plurality of devices or an apparatus including a single device.

The present invention can also be applied to a case wherein the invention is achieved by supplying a program to such system or apparatus. In this case, the system or apparatus can enjoy the effects of the present invention by loading a storage medium that stores a program expressed by software used to achieve the present invention by the system or apparatus.

Moreover, the system or apparatus can enjoy the effects of the present invention when a communication program downloads and reads out the program expressed by software used to achieve the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-302133, filed Nov. 7, 2006, which is hereby incorporated by reference herein in its entirety.

What is claimed is:

1. A display control apparatus comprising:
an input unit comprising direction keys used for moving a cursor indicating a selected object and numeric keys used for directly selecting an object and adapted to accept a key operation from a user;
a display unit adapted to display a first type of selection screen which allows the user to select an object displayed therein by using the direction keys and to display a second type of selection screen which allows the user to select an object displayed therein by using the numeric keys; and
a display controller adapted to control said display unit to switch between the first type of selection screen and the second type of selection screen including an identical information in at least certain areas thereof in accordance with the types of keys operated on said input unit,
wherein if the key operation using the numeric key is accepted when said display controller controls said display unit to display the first type of selection screen, then said display controller switches the first type of selection screen to the second type of selection screen to allow the user to select an object displayed therein by using the numeric keys, and
wherein if the key operation using the direction key is accepted when said display controller controls said display unit to display the second type of selection screen, then said display controller switches the second type of selection screen to the first type of selection screen to allow the user to select an object displayed therein by using the direction keys.

2. The apparatus according to claim 1, wherein said display controller switches screens between the first type of selection screen which arranges and displays objects representing at least information of programs to be television-broadcast in an order of broadcast time zones for each of plural channels, and the second type of selection screen which arranges and displays objects representing at least information of programs to be television-broadcast in an order of broadcast time zones for a single channel.

3. The apparatus according to claim 2, wherein while said display controller controls said display unit to display the first type of selection screen corresponding to the key operation using the direction key, when the key operation using the numeric key, and the key operation using a first key or a second key of the direction key immediately before the key operation using the numeric key are accepted, said display controller switches the first type of selection screen to the second type of selection screen corresponding to the key operation using the numeric key, and
while said display controller controls said display unit to display the first type of selection screen, when the key operation using the numeric key, and the key operation using a third key or a fourth key of the direction key immediately before the key operation using the numeric type of key are accepted, said display controller switches the first type of selection screen to a third type of selection screen which arranges and displays objects representing information of programs to be television-broadcast in plural channels within a single time zone.

4. The apparatus according to claim 3, wherein said display controller controls to identifiably display a program selected on the first type of selection screen and the second screen type of selection,
while said display controller controls said display unit to display the first type of selection screen, when the key operation using the numeric key, and the key operation using the first key of the direction key immediately before the key operation using the numeric key are accepted, said display controller switches the first type of selection screen to the second type of selection screen on which the program identifiably displayed upon acceptance of the key operation using the numeric key is located at a center of the displayed programs, and
while said display controller controls said display unit to display the first type of selection screen, when the key operation using the numeric key, and the key operation using the second key of the direction key immediately before the key operation using the numeric key are accepted, said display controller switches the first type of selection screen to the second type of selection screen on which the program identifiably displayed upon acceptance of the key operation using the numeric key is located at a head of the displayed programs.

5. The apparatus according to claim 3, wherein said display controller controls said display to identifiably display a program selected on the first type of selection screen and the second type of selection screen,
while said display controller controls said display unit to display the first type of selection screen, when the key operation using the numeric key, and the key operation using the third key of the direction key immediately before the key operation using the numeric key are accepted, said display controller switches the first type of selection screen to the third type of selection screen on which the program identifiably displayed upon acceptance of the key operation using the numeric key is located at a center of the displayed programs, and while said display controller controls said display unit to display the first type of selection screen, when the key operation using the numeric key, and the key operation using the fourth key of the direction key immediately before the key operation using the numeric key are accepted, said display controller switches the first type of selection screen to the third type of selection screen on which the program identifiably displayed upon acceptance of the key operation using the numeric key is located at a head of the displayed programs.

6. The apparatus according to claim 3, wherein the second and third types of selection screens arrange and display objects representing information of the program in correspondence with a layout of the numeric keys on said input unit.

7. The apparatus according to claim 3, wherein while said display controller controls said display unit to display the second type of selection screen, when the key operation using the direction key and the key operation using the numeric key immediately before the key operation using the direction key are accepted, said display controller switches the second type of selection screen to the first type of selection screen including channels according to a type of the accepted numeric key.

8. A display control method comprising:

an acceptance step of accepting a key operation from a user via an input unit comprising direction keys used for moving a cursor indicating a selected object and numeric keys used for directly selecting an object;

a display step of displaying, on a display unit, a first type of selection screen which allows the user to select an object displayed therein by using the direction keys and to display a second type of selection screen which allows the user to select an object displayed therein by using the numeric keys; and a display control step of controlling said display unit to switch between the first type of selection screen and the second type of selection screen including an identical information in at least certain areas thereof, in accordance with the types of keys operated on the input unit, wherein if the key operation using the numeric key is accepted when said display unit is controlled in the control step to display the first type of selection screen, then the screen is switched from the first type of selection screen to the second type of selection screen to allow the user to select an object displayed therein by using the numeric keys, and wherein if the key operation using the direction key is accepted when said display unit is controlled in the control step to display the second type of selection screen, then the screen is switched from the second type of selection screen to the first type of selection screen to allow the user to select an object displayed therein by using the direction keys.

9. The method according to claim 8, wherein in the display control step screens are switched between the first type of selection screen which arranges and displays objects representing at least information of programs to be television-broadcast in an order of broadcast time zones for each of plural channels, and the second type of selection screen which arranges and displays objects representing at least information of programs to be television-broadcast in an order of broadcast time zones for a single channel.

10. The method according to claim 9, wherein while the display unit is controlled in the display control step to display the first type of selection screen corresponding to the key operation using the direction key, when the key operation using the numeric key, and the key operation using a first key or a second key of the direction key immediately before the key operation using the numeric key are accepted, the first type of selection screen is switched to the second type of selection screen corresponding to the key operation using the numeric key, and while the display unit is controlled in the display control step to display the first type of selection screen, when the key operation using the numeric key, and the key operation using a third key or a fourth key of the direction key immediately before the key operation using the numeric key are accepted, the first type of selection screen is switched to a third type of selection screen which arranges and displays objects representing information of programs to be television-broadcast in plural channels within a single time zone.

11. The method according to claim 10, wherein a program selected on the first type of selection screen and the second type of selection screen is identifiably displayed in the display control step, while the display unit is controlled in the display control step to display the first type of selection screen, when the key operation using the numeric key, and the key operation using the first key of the direction key immediately before the key operation using the numeric key are accepted, the first type of selection screen is switched to the second type of selection screen on which the program identifiably displayed upon acceptance of the key operation using the numeric key is located at a center of the displayed programs, and while the display unit is controlled in the display control step to display the first type of selection screen, when the key operation using the numeric key, and the key operation using the second key of the direction key immediately before the key operation using the numeric key are accepted, the first type of selection screen is switched to the second type of selection screen on which the program identifiably displayed upon acceptance of the key operation using the numeric key is located at a head of the displayed programs.

12. The method according to claim 10, wherein a program selected on the first type of selection screen and the second type of selection screen is identifiably displayed in the display control step, while the display unit is controlled in the display control step to display the first type of selection screen, when the key operation using the numeric key, and the key operation using the third key of the direction key immediately before the key operation using the numeric key are accepted, the first type of selection screen is switched to the third type of selection screen on which the program identifiably displayed upon acceptance of the key operation using the numeric key is located at a center of the displayed programs, and while the display unit is controlled in the display control step to display the first type of selection screen, when the key operation using the numeric key, and the key operation using the fourth key of the direction key immediately before the key operation using the numeric key are accepted, the first type of selection screen is switched to the third type of selection screen on which the program identifiably displayed upon acceptance of the key operation using the numeric key is located at a head of the displayed programs.

13. The method according to claim 10, wherein the second and third types of selection screens arrange and display objects representing information of the program in correspondence with a layout of the numeric keys on the input unit.

14. The method according to claim 10, wherein while the display unit is controlled in the display control step to display the second type of selection screen, when the key operation using the direction key and the numeric key immediately before the key operation using the direction key are accepted, the second type of selection screen is switched to the first type of selection screen including channels according to a type of the accepted numeric key.

15. A non-transitory computer-readable storage medium storing a program, said program making a computer function as a display control apparatus comprising:

an input unit comprising direction keys used for moving a cursor indicating a selected object and numeric keys used for directly selecting an object and adapted to accept a key operation from a user;

a display unit adapted to display a first type of selection screen which allows the user to select an object displayed therein by using the direction keys and to display a second type of selection screen which allows the user to select an object displayed therein by using the numeric keys; and a display controller adapted to control said display unit to switch between the first type of selection screen and the second type of selection screen including an identical information in at least certain areas thereof in accordance with the types of keys operated on said input unit, wherein if the key operation using the numeric key is accepted when said display controller controls said display unit to display the first type of selection screen, then said display controller switches the first type of selection screen to the second type of selection screen to allow the user to select an object displayed therein by using the numeric keys, and wherein if the key operation using the direction key is accepted when said display controller controls said display unit to display the second type of selection screen, then said display controller switches the second type of selection screen to the first type of selection screen to allow the user to select an object displayed therein by using the direction keys.

* * * * *